US010557107B2

(12) United States Patent
Sun et al.

(10) Patent No.: US 10,557,107 B2
(45) Date of Patent: Feb. 11, 2020

(54) POST CHEMICAL MECHANICAL POLISHING FORMULATIONS AND METHOD OF USE

(71) Applicant: Entegris, Inc., Billerica, MA (US)

(72) Inventors: Laisheng Sun, Danbury, CT (US); Peng Zhang, Montvale, NJ (US); Jun Liu, Brookfield, CT (US); Steven Medd, Danbury, CT (US); Jeffrey A. Barnes, Danielsville, PA (US); Shrane Ning Jenq, Hsinchu County (TW)

(73) Assignee: ENTEGRIS, INC., Billerica, MA (US)

( * ) Notice: Subject to any disclaimer, the term of this patent is extended or adjusted under 35 U.S.C. 154(b) by 97 days.

(21) Appl. No.: 15/971,535

(22) Filed: May 4, 2018

(65) Prior Publication Data

US 2018/0251712 A1    Sep. 6, 2018

Related U.S. Application Data

(63) Continuation of application No. 15/115,165, filed as application No. PCT/US2015/013521 on Jan. 29, 2015, now abandoned.

(60) Provisional application No. 61/933,015, filed on Jan. 29, 2014.

(51) Int. Cl.
| | | |
|---|---|---|
| C11D 7/32 | (2006.01) |
| C11D 11/00 | (2006.01) |
| C11D 1/62 | (2006.01) |
| C23G 1/20 | (2006.01) |
| H01L 21/02 | (2006.01) |
| C11D 3/00 | (2006.01) |
| C11D 3/30 | (2006.01) |

(52) U.S. Cl.
CPC ............ *C11D 11/0047* (2013.01); *C11D 1/62* (2013.01); *C11D 3/0073* (2013.01); *C11D 3/30* (2013.01); *C11D 7/32* (2013.01); *C11D 7/3209* (2013.01); *C23G 1/20* (2013.01); *H01L 21/02063* (2013.01); *H01L 21/02065* (2013.01); *H01L 21/02074* (2013.01)

(58) Field of Classification Search
CPC .................................................. C11D 11/0047
USPC ....................................................... 510/175
See application file for complete search history.

(56) References Cited

U.S. PATENT DOCUMENTS

| | | | |
|---|---|---|---|
| 5,320,709 A | 6/1994 | Bowden |
| 5,702,075 A | 12/1997 | Lehrman |
| 5,976,928 A | 11/1999 | Kirlin et al. |
| 5,993,685 A | 11/1999 | Currie et al. |
| 6,194,366 B1 | 2/2001 | Naghshineh et al. |
| 6,211,126 B1 | 4/2001 | Wojtczak et al. |
| 6,224,785 B1 | 5/2001 | Wojtczak et al. |
| 6,280,651 B1 | 8/2001 | Wojtczak et al. |
| 6,306,807 B1 | 10/2001 | Wojtczak et al. |
| 6,322,600 B1 | 11/2001 | Brewer et al. |
| 6,323,168 B1 | 11/2001 | Kloffenstein et al. |
| 6,344,432 B1 | 2/2002 | Wojtczak et al. |
| 6,346,741 B1 | 2/2002 | Van Buskirk et al. |
| 6,395,194 B1 | 5/2002 | Russell et al. |
| 6,409,781 B1 | 6/2002 | Wojtczak et al. |
| 6,492,308 B1 | 12/2002 | Naghshineh et al. |
| 6,527,819 B2 | 3/2003 | Wojtczak et al. |
| 6,566,315 B2 | 5/2003 | Wojtczak et al. |
| 6,585,825 B1 | 7/2003 | Skee |
| 6,627,587 B2 | 9/2003 | Naghshineh et al. |
| 6,723,691 B2 | 4/2004 | Naghshineh et al. |
| 6,735,978 B1 | 5/2004 | Tom et al. |
| 6,755,989 B2 | 6/2004 | Wojtczak et al. |
| 6,773,873 B2 | 8/2004 | Seijo et al. |
| 6,800,218 B2 | 10/2004 | Ma et al. |
| 6,802,983 B2 | 10/2004 | Mullee et al. |
| 6,849,200 B2 | 2/2005 | Baum et al. |
| 6,858,825 B1 | 2/2005 | Ruffa |
| 6,875,733 B1 | 4/2005 | Wojtczak |
| 6,896,826 B2 | 5/2005 | Wojtczak et al. |
| 6,943,139 B2 | 9/2005 | Korzenski et al. |
| 6,989,358 B2 | 1/2006 | Korzenski et al. |
| 7,011,716 B2 | 3/2006 | Xu et al. |
| 7,029,373 B2 | 4/2006 | Ma et al. |
| 7,030,168 B2 | 4/2006 | Xu et al. |
| 7,119,052 B2 | 10/2006 | Korzenski et al. |
| 7,119,418 B2 | 10/2006 | Xu et al. |
| 7,160,815 B2 | 1/2007 | Korzenski et al. |
| 7,223,352 B2 | 5/2007 | Korzenski et al. |
| 7,300,601 B2 | 11/2007 | Liu et al. |

(Continued)

FOREIGN PATENT DOCUMENTS

| | | |
|---|---|---|
| EP | 2 988 321 A1 | 2/2016 |
| EP | 3 051 577 A1 | 8/2016 |
| JP | 2002-62668 A | 2/2002 |
| JP | 2011159658 A | 8/2011 |
| JP | 2012021151 A | 2/2012 |
| JP | 2012062572 A | 3/2012 |
| JP | 2012186470 A | 9/2012 |
| JP | 2012251026 A | 12/2012 |
| KR | 1020110106880 A1 | 9/2011 |
| WO | 2006110645 A2 | 10/2006 |
| WO | 2006127885 A1 | 11/2006 |
| WO | 2007027522 A2 | 3/2007 |

(Continued)

OTHER PUBLICATIONS

International Search Report/Written Opinion, dated May 22, 2015.

*Primary Examiner* — Gregory E Webb
(74) *Attorney, Agent, or Firm* — Entegris, Inc.

(57) ABSTRACT

A cleaning composition and process for cleaning post-chemical mechanical polishing (CMP) residue and contaminants from a microelectronic device having said residue and contaminants thereon. The cleaning compositions are substantially devoid of alkali hydroxides, alkaline earth metal hydroxides, and tetramethylammonium hydroxide. The composition achieves highly efficacious cleaning of the post-CMP residue and contaminant material from the surface of the microelectronic device without compromising the low-k dielectric material or the copper interconnect material.

8 Claims, No Drawings

(56) References Cited

U.S. PATENT DOCUMENTS

| | | |
|---|---|---|
| 7,326,673 B2 | 2/2008 | Xu et al. |
| 7,335,239 B2 | 2/2008 | Baum |
| 7,361,603 B2 | 4/2008 | Liu et al. |
| 7,365,045 B2 | 4/2008 | Walker et al. |
| 7,485,611 B2 | 2/2009 | Roeder et al. |
| 7,534,752 B2 | 5/2009 | Wojtczak et al. |
| 7,553,803 B2 | 6/2009 | Korzenski et al. |
| 7,557,073 B2 | 7/2009 | Korzenski et al. |
| 7,736,405 B2 | 6/2010 | Darsillo et al. |
| 7,888,301 B2 | 2/2011 | Bernhard et al. |
| 7,922,824 B2 | 4/2011 | Minsek et al. |
| 7,923,423 B2 | 4/2011 | Walker et al. |
| 7,960,328 B2 | 6/2011 | Visintin et al. |
| 8,026,200 B2 | 9/2011 | Cooper et al. |
| 8,058,219 B2 | 11/2011 | Rath et al. |
| 8,114,220 B2 | 2/2012 | Visintin et al. |
| 8,178,585 B2 | 5/2012 | Petruska et al. |
| 8,236,485 B2 | 8/2012 | Minsek et al. |
| 8,304,344 B2 | 11/2012 | Boggs et al. |
| 8,338,087 B2 | 12/2012 | Rath et al. |
| 8,367,555 B2 | 2/2013 | Afzali-Ardakani et al. |
| 8,618,036 B2 | 12/2013 | Afzali-Ardakani et al. |
| 8,685,909 B2 | 4/2014 | Angst et al. |
| 8,754,021 B2 | 6/2014 | Barnes et al. |
| 8,778,210 B2 | 7/2014 | Cooper et al. |
| 8,951,948 B2 | 2/2015 | Rath et al. |
| 9,045,717 B2 | 6/2015 | Nakanishi et al. |
| 9,063,431 B2 | 6/2015 | Barnes et al. |
| 9,074,169 B2 | 7/2015 | Chen et al. |
| 9,074,170 B2 | 7/2015 | Barnes et al. |
| 9,175,404 B2 | 11/2015 | Kojima et al. |
| 9,215,813 B2 | 12/2015 | Brosseau et al. |
| 9,221,114 B2 | 12/2015 | Chen et al. |
| 9,238,850 B2 | 1/2016 | Korzenski et al. |
| 9,416,338 B2 | 8/2016 | Cooper et al. |
| 2005/0118832 A1 | 6/2005 | Korzenski et al. |
| 2005/0145311 A1 | 7/2005 | Walker et al. |
| 2005/0205835 A1* | 9/2005 | Tamboli ............... C11D 3/2086 252/79.1 |
| 2005/0227482 A1 | 10/2005 | Korzenski et al. |
| 2005/0263490 A1 | 12/2005 | Liu et al. |
| 2006/0019850 A1 | 1/2006 | Korzenski et al. |
| 2006/0063687 A1 | 3/2006 | Minsek et al. |
| 2006/0148666 A1 | 7/2006 | Peters et al. |
| 2006/0154186 A1 | 7/2006 | Minsek et al. |
| 2006/0172906 A1 | 8/2006 | Wu et al. |
| 2006/0249482 A1 | 11/2006 | Wrschka et al. |
| 2007/0161528 A1* | 7/2007 | Wu ....................... C11D 3/046 510/175 |
| 2007/0251551 A1 | 11/2007 | Korzenski et al. |
| 2008/0076688 A1 | 3/2008 | Barnes et al. |
| 2008/0125342 A1 | 5/2008 | Visintin et al. |
| 2008/0271991 A1 | 11/2008 | Korzenski et al. |
| 2009/0032766 A1 | 2/2009 | Rajaratnam et al. |
| 2009/0192065 A1 | 7/2009 | Korzenski et al. |
| 2009/0212021 A1 | 8/2009 | Bernhard et al. |
| 2009/0215269 A1 | 8/2009 | Boggs et al. |
| 2009/0239777 A1* | 9/2009 | Angst ................... C11D 3/0084 510/175 |
| 2009/0253072 A1 | 10/2009 | Petruska et al. |
| 2009/0291873 A1* | 11/2009 | Tamboli ............... C11D 3/2075 510/175 |
| 2009/0301996 A1 | 12/2009 | Visintin et al. |
| 2010/0056410 A1 | 3/2010 | Visintin et al. |
| 2010/0065530 A1 | 3/2010 | Walker et al. |
| 2010/0087065 A1 | 4/2010 | Boggs et al. |
| 2010/0112728 A1 | 5/2010 | Korzenski et al. |
| 2010/0163788 A1 | 7/2010 | Visintin et al. |
| 2010/0261632 A1 | 10/2010 | Korzenski et al. |
| 2010/0286014 A1 | 11/2010 | Barnes |
| 2011/0039747 A1 | 2/2011 | Zhou et al. |
| 2011/0117751 A1 | 5/2011 | Sonthalia et al. |
| 2012/0021961 A1 | 1/2012 | Klipp et al. |
| 2012/0042898 A1 | 2/2012 | Visintin et al. |
| 2012/0283163 A1* | 11/2012 | Barnes .................. C11D 1/72 510/175 |
| 2013/0270217 A1 | 10/2013 | Yoshida et al. |
| 2013/0280123 A1 | 10/2013 | Chen et al. |
| 2013/0295712 A1 | 11/2013 | Chen et al. |
| 2014/0038420 A1 | 2/2014 | Chen et al. |
| 2014/0306162 A1 | 10/2014 | Poe et al. |
| 2014/0318584 A1 | 10/2014 | Cooper et al. |
| 2014/0319423 A1 | 10/2014 | Cooper |
| 2015/0027978 A1 | 1/2015 | Barnes et al. |
| 2015/0045277 A1* | 2/2015 | Liu ................... H01L 21/02074 510/175 |
| 2015/0050199 A1 | 2/2015 | Korzenski et al. |
| 2015/0075570 A1 | 3/2015 | Wu et al. |
| 2015/0114429 A1 | 4/2015 | Jenq et al. |
| 2015/0162213 A1 | 6/2015 | Chen et al. |
| 2015/0168843 A1 | 6/2015 | Cooper et al. |
| 2015/0344825 A1 | 12/2015 | Cooper et al. |
| 2016/0020087 A1 | 1/2016 | Liu et al. |
| 2016/0032186 A1 | 2/2016 | Chen et al. |
| 2016/0075971 A1 | 3/2016 | Liu et al. |
| 2016/0122696 A1 | 5/2016 | Liu et al. |
| 2016/0130500 A1 | 5/2016 | Chen et al. |
| 2016/0185595 A1 | 6/2016 | Chen et al. |
| 2016/0200975 A1 | 7/2016 | Cooper et al. |
| 2016/0314990 A1 | 10/2016 | Bilodeau et al. |
| 2016/0322232 A1 | 11/2016 | Bilodeau et al. |
| 2016/0340620 A1 | 11/2016 | Sun et al. |
| 2016/0343576 A1 | 11/2016 | Bilodeau et al. |

FOREIGN PATENT DOCUMENTS

| | | |
|---|---|---|
| WO | 2008036823 A2 | 3/2008 |
| WO | 2008157345 A2 | 12/2008 |
| WO | 2009/046637 A1 | 4/2009 |
| WO | 2009073596 A2 | 6/2009 |
| WO | 2010017160 A2 | 2/2010 |
| WO | 2010039936 A2 | 4/2010 |
| WO | 2010086745 A1 | 8/2010 |
| WO | 2010091045 A2 | 8/2010 |
| WO | 2012154498 A2 | 11/2012 |
| WO | 2012174518 A2 | 12/2012 |
| WO | 2013058770 A1 | 4/2013 |
| WO | 2013/101907 A1 | 7/2013 |
| WO | 2013/142250 A1 | 9/2013 |
| WO | 2013138278 A1 | 9/2013 |
| WO | 2013173743 A2 | 11/2013 |
| WO | 2015/053800 A2 | 4/2015 |
| WO | 2015116679 A1 | 8/2015 |
| WO | 2015130607 A1 | 9/2015 |

* cited by examiner

POST CHEMICAL MECHANICAL POLISHING FORMULATIONS AND METHOD OF USE

CROSS REFERENCE TO RELATED APPLICATIONS

This application is a continuation of U.S. patent application Ser. No. 15/115,165, filed Jul. 28, 2016, which claims priority and the benefit from International Application No. PCT/US2015/013521, filed Jan. 29, 2015, which in turn claims priority to and the benefit of U.S. Provisional Patent Application Ser. No. 61/933,015, filed on Jan. 29, 2014, all of which are incorporated herein by reference in their entireties.

FIELD

The present invention relates generally to compositions including corrosion inhibitors for cleaning residue and/or contaminants from microelectronic devices having same thereon.

DESCRIPTION OF THE RELATED ART

Microelectronic device wafers are used to form integrated circuits. The microelectronic device wafer includes a substrate, such as silicon, into which regions are patterned for deposition of different materials having insulative, conductive or semi-conductive properties.

In order to obtain the correct patterning, excess material used in forming the layers on the substrate must be removed. Further, to fabricate functional and reliable circuitry, it is important to prepare a flat or planar microelectronic wafer surface prior to subsequent processing. Thus, it is necessary to remove and/or polish certain surfaces of a microelectronic device wafer.

Chemical Mechanical Polishing or Planarization ("CMP") is a process in which material is removed from a surface of a microelectronic device wafer, and the surface is polished (more specifically, planarized) by coupling a physical process such as abrasion with a chemical process such as oxidation or chelation. In its most rudimentary form, CMP involves applying slurry, e.g., a solution of an abrasive and an active chemistry, to a polishing pad that buffs the surface of a microelectronic device wafer to achieve the removal, planarization, and polishing processes. It is not desirable for the removal or polishing process to be comprised of purely physical or purely chemical action, but rather the synergistic combination of both in order to achieve fast, uniform removal. In the fabrication of integrated circuits, the CMP slurry should also be able to preferentially remove films that comprise complex layers of metals and other materials so that highly planar surfaces can be produced for subsequent photolithography, or patterning, etching and thin-film processing.

Recently, copper has been increasingly used for metal interconnects in integrated circuits. In copper damascene processes commonly used for metallization of circuitry in microelectronic device fabrication, the layers that must be removed and planarized include copper layers having a thickness of about 1-1.5 µm and copper seed layers having a thickness of about 0.05-0.15 µm. These copper layers are separated from the dielectric material surface by a layer of barrier material, typically about 50-300 Å thick, which prevents diffusion of copper into the oxide dielectric material. One key to obtaining good uniformity across the wafer surface after polishing is to use a CMP slurry that has the correct removal selectivities for each material.

The foregoing processing operations, involving wafer substrate surface preparation, deposition, plating, etching and chemical mechanical polishing, variously require cleaning operations to ensure that the microelectronic device product is free of contaminants that would otherwise deleteriously affect the function of the product, or even render it useless for its intended function. Often, particles of these contaminants are smaller than 0.3 µm.

One particular issue in this respect is the residues that are left on the microelectronic device substrate following CMP processing. Such residues include CMP material and corrosion inhibitor compounds such as benzotriazole (BTA). If not removed, these residues can cause damage to copper lines or severely roughen the copper metallization, as well as cause poor adhesion of post-CMP applied layers on the device substrate. Severe roughening of copper metallization is particularly problematic, since overly rough copper can cause poor electrical performance of the product microelectronic device.

Another residue-producing process common to microelectronic device manufacturing involves gas-phase plasma etching to transfer the patterns of developed photoresist coatings to the underlying layers, which may consist of hardmask, interlevel dielectric (ILD), and etch stop layers. Post-gas phase plasma etch residues, which may include chemical elements present on the substrate and in the plasma gases, are typically deposited on the back end of the line (BEOL) structures and if not removed, may interfere with subsequent silicidation or contact formation. Conventional cleaning chemistries often damage the ILD, absorb into the pores of the ILD thereby increasing the dielectric constant, and/or corrode the metal structures.

There is a continuing need in the art to provide compositions and methods that effectively remove residue from a substrate, e.g., post-CMP residue, post-etch residue, and post-ash residue. The compositions are more environmentally friendly than the prior art compositions and can include innovative components and as such, can be considered an alternative to the compositions of the prior art.

SUMMARY

The present invention generally relates to a composition and process for cleaning residue and/or contaminants from microelectronic devices having said residue and contaminants thereon. The cleaning compositions of the invention are substantially devoid of alkali hydroxides, alkaline earth metal hydroxides, and tetramethylammonium hydroxide. The residue may include post-CMP, post-etch, and/or post-ash residue.

In one aspect, a cleaning composition is described, said composition comprising at least one quaternary base, at least one organic amine, at least one corrosion inhibitor, and at least one solvent, wherein the corrosion inhibitor is selected from the group consisting of 4-methylpyrazole, pyrazole, 2-amino-thiazole, 2-amino-1,3,4-thiadiazole, pterine, pyrazine, cytosine, pyridazine, derivatives thereof, and combinations thereof, and wherein the cleaning composition is substantially devoid of alkali hydroxides, alkaline earth metal hydroxides, and tetramethylammonium hydroxide.

In another aspect, a cleaning composition is described, said composition comprising at least one cleaning additive, at least one complexing agent, and at least one basic compound, wherein the composition is substantially devoid of amines, alkali hydroxides, alkaline earth metal hydroxides, and tetramethylammonium hydroxide.

In still another aspect, a method of removing residue and contaminants from a microelectronic device having said residue and contaminants thereon is described, said method comprising contacting the microelectronic device with a cleaning composition for sufficient time to at least partially clean said residue and contaminants from the microelectronic device, wherein said composition comprises at least one quaternary base, at least one organic amine, at least one corrosion inhibitor, and at least one solvent, wherein the corrosion inhibitor is selected from the group consisting of 4-methylpyrazole, pyrazole, 2-amino-thiazole, 2-amino-1,3,4-thiadiazole, pterine, pyrazine, cytosine, pyridazine, derivatives thereof, and combinations thereof, and wherein the cleaning composition is substantially devoid of alkali hydroxides, alkaline earth metal hydroxides, and tetramethylammonium hydroxide.

In yet another aspect, a method of removing residue and contaminants from a microelectronic device having said residue and contaminants thereon is described, said method comprising contacting the microelectronic device with a cleaning composition for sufficient time to at least partially clean said residue and contaminants from the microelectronic device, wherein said composition comprises at least one cleaning additive, at least one complexing agent, and at least one basic compound, wherein the composition is substantially devoid of amines, alkali hydroxides, alkaline earth metal hydroxides, and tetramethylammonium hydroxide.

Other aspects, features and advantages will be more fully apparent from the ensuing disclosure and appended claims.

DETAILED DESCRIPTION, AND PREFERRED EMBODIMENTS THEREOF

The present invention relates generally to compositions useful for the removal of residue and contaminants from a microelectronic device having such material(s) thereon. The compositions are particularly useful for the removal of post-CMP, post-etch or post-ash residue.

For ease of reference, "microelectronic device" corresponds to semiconductor substrates, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly.

As used herein, "residue" corresponds to particles generated during the manufacture of a microelectronic device including, but not limited to, plasma etching, ashing, chemical mechanical polishing, wet etching, and combinations thereof.

As used herein, "contaminants" correspond to chemicals present in the CMP slurry, reaction by-products of the polishing slurry, chemicals present in the wet etching composition, reaction by products of the wet etching composition, and any other materials that are the by-products of the CMP process, the wet etching, the plasma etching or the plasma ashing process.

As used herein, "post-CMP residue" corresponds to particles from the polishing slurry, e.g., silica-containing particles, chemicals present in the slurry, reaction by-products of the polishing slurry, carbon-rich particles, polishing pad particles, brush deloading particles, equipment materials of construction particles, metals, metal oxides, organic residues, and any other materials that are the by-products of the CMP process. As defined herein, the "metals" that are typically polished include copper, aluminum and tungsten.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, "complexing agent" includes those compounds that are understood by one skilled in the art to be complexing agents, chelating agents and/or sequestering agents. Complexing agents will chemically combine with or physically hold the metal atom and/or metal ion to be removed using the compositions described herein.

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, tungsten, cobalt, and other refractory metals and their nitrides and silicides.

As defined herein, "post-etch residue" corresponds to material remaining following gas-phase plasma etching processes, e.g., BEOL dual damascene processing, or wet etching processes. The post-etch residue may be organic, organometallic, organosilicic, or inorganic in nature, for example, silicon-containing material, carbon-based organic material, and etch gas residue such as oxygen and fluorine.

As defined herein, "post-ash residue," as used herein, corresponds to material remaining following oxidative or reductive plasma ashing to remove hardened photoresist and/or bottom anti-reflective coating (BARC) materials. The post-ash residue may be organic, organometallic, organosilicic, or inorganic in nature.

"Substantially devoid" is defined herein as less than 2 wt. %, preferably less than 1 wt. %, more preferably less than 0.5 wt. %, and most preferably less than 0.1 wt. %. In one embodiment, "substantially devoid" corresponds to zero percent.

As used herein, "about" is intended to correspond to ±5% of the stated value.

For the purposes of this invention, an "amine" is defined as at least one primary, secondary, or tertiary amine, and/or ammonia, with the proviso that (i) an amide group, (ii) species including both a carboxylic acid group and an amine group, (iii) surfactants that include amine groups, and (iv) species where the amine group is a substituent (e.g., attached to an aryl or heterocyclic moiety), are not considered "amines" according to this definition. The amine formula can be represented by $NR^1R^2R^3$, wherein $R^1$, $R^2$ and $R^3$ can be the same as or different from one another and are selected from the group consisting of hydrogen, straight-chained or branched $C_1$-$C_6$ alkyls (e.g., methyl, ethyl, propyl, butyl, pentyl, hexyl), $C_6$-$C_{10}$ aryls (e.g., benzyl), straight-chained or branched $C_1$-$C_6$ alkanols (e.g., methanol, ethanol, propanol, butanol, pentanol, hexanol), and combinations thereof, with the proviso that $R^1$, $R^2$ and $R^3$ cannot all be hydrogen.

As defined herein, "reaction or degradation products" include, but are not limited to, product(s) or byproduct(s) formed as a result of catalysis at a surface, oxidation, reduction, reactions with the compositional components, or that otherwise polymerize; product(s) or byproduct(s) formed formed as a result of a change(s) or transformation(s) in which a substance or material (e.g., molecules, compounds, etc.) combines with other substances or materials, interchanges constituents with other substances or materials, decomposes, rearranges, or is otherwise chemically and/or physically altered, including intermediate product(s) or byproduct(s) of any of the foregoing or any combination of the foregoing reaction(s), change(s) and/or transformation(s). It should be appreciated that the reaction or degradation products may have a larger or smaller molar mass than the original reactant.

As used herein, "suitability" for cleaning residue and contaminants from a microelectronic device having said residue and contaminants thereon corresponds to at least partial removal of said residue/contaminants from the microelectronic device. Cleaning efficacy is rated by the reduction of objects on the microelectronic device. For example, pre- and post-cleaning analysis may be carried out using an atomic force microscope. The particles on the sample may be registered as a range of pixels. A histogram (e.g., a Sigma Scan Pro) may be applied to filter the pixels in a certain intensity, e.g., 231-235, and the number of particles counted. The particle reduction may be calculated using:

$$\text{Cleaning Efficacy} = \frac{\left(\begin{array}{c}\text{Number of PreClean Objects} - \\ \text{Number of PostClean Objects}\end{array}\right)}{\text{Number of PreClean Objects}} \times 100$$

Notably, the method of determination of cleaning efficacy is provided for example only and is not intended to be limited to same. Alternatively, the cleaning efficacy may be considered as a percentage of the total surface that is covered by particulate matter. For example, AFM's may be programmed to perform a z-plane scan to identify topographic areas of interest above a certain height threshold and then calculate the area of the total surface covered by said areas of interest. One skilled in the art would readily understand that the less area covered by said areas of interest post-cleaning, the more efficacious the cleaning composition. Preferably, at least 75% of the residue/contaminants are removed from the microelectronic device using the compositions described herein, more preferably at least 90%, even more preferably at least 95%, and most preferably at least 99% of the residue/contaminants are removed.

Compositions described herein may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

In a first aspect, the cleaning compositions include at least one corrosion inhibitor, where the corrosion inhibitor component is added to the cleaning composition to lower the corrosion rate of metals, e.g., copper, aluminum, as well as enhance the cleaning performance. Corrosion inhibitors contemplated include, but are not limited to: 4-methylpyrazole, pyrazole, 2-amino-thiazole, adenosine, 2-amino-1,3,4-thiadiazole, 5-amino-1H-tetrazole, adenine, pterine, pyrimidine, pyrazine, cytosine, pyridazine, 1H-pyrazole-3-carboxylic acid, 1H-pyrazole-4-carboxylic acid, 3-amino-5-hydroxy-1H-pyrazole, 3-amino-5-methyl-1H-pyrazole, 3-amino-5-tert-butyl-1H-pyrazole, 2-amino-methylthiazole, 2-mercaptothiazole, 2,5-dimercapto-1,3,4-thiadiazole, 2-mercapto-5-methyl-1,3,4-thiadiazole, 2-aminothiazole-5-carbonitrile, 2-aminothiazole-5-carboxaldehyde, ethyl 2-aminothiazole-4-carboxylate, 1,2,3-triazole, 1,2,4-triazole, imidazole, 3-amino-1,2,4-triazole derivatives thereof, and combinations thereof. Preferably, the corrosion inhibitors are selected from the group consisting of 4-methylpyrazole, pyrazole, 2-amino-thiazole, 2-amino-1,3,4-thiadiazole, pterine, pyrazine, cytosine, pyridazine, derivatives thereof, and combinations thereof. Most preferably, the corrosion inhibitors comprise pyrazole.

In one embodiment, the cleaning composition of the first aspect comprises at least one solvent and at least one corrosion inhibitor. Preferably, the solvent comprises water, and more preferably deionized water.

In a further embodiment the cleaning composition of the first aspect comprises, consists of, or consists essentially of at least one corrosion inhibitor, at least one quaternary base, at least one organic amine, at least one solvent (e.g., water), and optionally at least one complexing agent, wherein the cleaning composition is substantially devoid of alkali hydroxides, alkaline earth metal hydroxides, and tetramethylammonium hydroxide.

In a particularly preferred embodiment, the cleaning composition of the first aspect comprises, consists of or consists essentially of at least one quaternary base, at least one organic amine, at least one corrosion inhibitor, and at least one solvent (e.g., water), wherein the corrosion inhibitor is selected from the group consisting of 4-methylpyrazole, pyrazole, 2-amino-thiazole, 2-amino-1,3,4-thiadiazole, pterine, pyrazine, cytosine, pyridazine, derivatives thereof, and combinations thereof, and wherein the cleaning composition is substantially devoid of alkali hydroxides, alkaline earth metal hydroxides, and tetramethylammonium hydroxide. The cleaning composition of the first aspect may further comprise at least one complexing agent.

In another particularly preferred embodiment, the cleaning composition of the first aspect comprises, consists of or consists essentially of at least one quaternary base, at least one organic amine, at least one corrosion inhibitor, at least one complexing agent, and at least one solvent (e.g., water), wherein the corrosion inhibitor is selected from the group consisting of 4-methylpyrazole, pyrazole, 2-amino-thiazole, 2-amino-1,3,4-thiadiazole, pterine, pyrazine, cytosine, pyridazine, derivatives thereof, and combinations thereof, and wherein the cleaning composition is substantially devoid of alkali hydroxides, alkaline earth metal hydroxides, and tetramethylammonium hydroxide.

Illustrative organic amines that may be useful in specific compositions include species having the general formula $NR^1R^2R^3$, wherein $R^1$, $R^2$ and $R^3$ may be the same as or different from one another and are selected from the group consisting of hydrogen, straight-chained or branched $C_1$-$C_6$ alkyl (e.g., methyl, ethyl, propyl, butyl, pentyl, and hexyl), straight-chained or branched $C_1$-$C_6$ alcohol (e.g., methanol, ethanol, propanol, butanol, pentanol, and hexanol), and straight chained or branched ethers having the formula $R^4$—O—$R^5$, where $R^4$ and $R^5$ may be the same as or different from one another and are selected from the group consisting of $C_1$-$C_6$ alkyls as defined above. Most preferably, at least one of $R^1$, $R^2$ and $R^3$ is a straight-chained or branched $C_1$-$C_6$ alcohol. Examples include, without limitation, alkanol amines such as alkanolamines such as aminoethylethanolamine, N-methylaminoethanol, aminoethoxyethanol, dimethylaminoethoxyethanol, diethanolamine, N-methyldiethanolamine, monoethanolamine, triethanolamine, 1-amino-2-propanol, 3-amino-1-propanol, diisopropylamine, isopropylamine, 2-amino-1-butanol, isobutanolamine, other $C_1$-$C_8$ alkanolamines, and combinations thereof; amines such as triethylenediamine, ethylenediamine, hexamethylenediamine, diethylenetriamine, triethylamine, trimethylamine, and combinations thereof; and combinations of amines and alkanolamines. When the amine includes the ether component, the amine may be considered an alkoxyamine, e.g., 1-methoxy-2-aminoethane. Alternatively, or in addition to the $NR^1R^2R^3$ amine, the amine may be a multi-functional amine including, but not limited to, tetraethylenepentamine (TEPA), 4-(2-hydroxyethyl)morpholine (HEM), N-aminoethylpiperazine (N-AEP), ethylenediaminetetraacetic acid (EDTA), 1,2-cyclohexanediamine-N,N,N',N'-tetraacetic acid (CDTA), glycine/ascorbic acid, iminodiacetic acid (IDA), 2-(hydroxyethyl)iminodiacetic acid (HIDA), nitrilotriacetic acid, thiourea, 1,1,3,3-tetramethyl urea, urea, urea derivatives, glycine, alanine, arginine, asparagine, aspartic acid, cysteine, glutamic acid, glutamine, histidine, isoleucine, leucine, lysine, methionine, phenylalanine, piperadine, N-(2-aminoethyl) piperadine, proline, pyrrolidine, serine, threonine, tryptophan, tyrosine, valine, and combinations thereof. Preferably, the amines include at least one species selected from the group consisting of monoethanolamine, triethanolamine, cysteine, or a combination thereof.

Quaternary bases contemplated herein include compounds having the formula $NR^1R^2R^3R^4OH$, wherein $R^1$, $R^2$, $R^3$ and $R^4$ may be the same as or different from one another and are selected from the group consisting of hydrogen, straight-chained or branched $C_1$-$C_6$ alkyl (e.g., methyl, ethyl, propyl, butyl, pentyl, and hexyl), and substituted or unsubstituted $C_6$-$C_{10}$ aryl, e.g., benzyl, with the proviso that $R^1$, $R^2$, $R^3$, and $R^4$ cannot all simultaneously be a methyl group. Tetraalkylammonium hydroxides that are commercially available include tetraethylammonium hydroxide (TEAH), tetrapropylammonium hydroxide (TPAH), tetrabutylammonium hydroxide (TBAH), tributylmethylammonium hydroxide (TBMAH), benzyltrimethylammonium hydroxide (BTMAH), choline hydroxide, tris(2-hydroxyethyl)methyl ammonium hydroxide, diethyldimethylammonium hydroxide, and combinations thereof, may be used. Tetraalkylammonium hydroxides which are not commercially available may be prepared in a manner analogous to the published synthetic methods used to prepare TEAH, TPAH, TBAH, TBMAH, and BTMAH, which are known to one ordinary of skill in the art. Another widely used quaternary ammonium base is choline hydroxide. Although not a quaternary base, it is contemplated that the bases potassium hydroxide, cesium hydroxide or rubidium hydroxide may be used in the absence of or the presence of the above-identified quaternary bases. Preferably, the quaternary base comprises TEAH, BTMAH, or a combination of TEAH and BTMAH.

The optional complexing agents contemplated herein include, but are not limited to, acetic acid, acetone oxime, acrylic acid, adipic acid, alanine, arginine, asparagine, aspartic acid, betaine, dimethyl glyoxime, formic acid, fumaric acid, gluconic acid, glutamic acid, glutamine, glutaric acid, glyceric acid, glycerol, glycolic acid, glyoxylic acid, histidine, iminodiacetic acid, isophthalic acid, itaconic acid, lactic acid, leucine, lysine, maleic acid, maleic anhydride, malic acid, malonic acid, mandelic acid, 2,4-pentanedione, phenylacetic acid, phenylalanine, phthalic acid, proline, propionic acid, pyrocatecol, pyromellitic acid, quinic acid, serine, sorbitol, succinic acid, tartaric acid, terephthalic acid, trimellitic acid, trimesic acid, tyrosine, valine, xylitol, ethylenediamine, oxalic acid, tannic acid, benzoic acid, ammonium benzoate, catechol, pyrogallol, resorcinol, hydroquinone, cyanuric acid, barbituric acid and derivatives such as 1,2-dimethylbarbituric acid, alpha-keto acids such as pyruvic acid, phosphonic acid and derivatives thereof such as 1-hydroxyethylidene-1,1-diphosphonic acid (HEDP), propanethiol, benzohydroxamic acids, salts and derivatives thereof, and combinations thereof. In a preferred embodiment, preferably the complexing agent comprises HEDP, tartaric acid, or a combination thereof.

In one aspect, the composition for cleaning post-CMP residue and contaminants comprises, consists of, or consists essentially of at least one quaternary base, at least one organic amine, at least one corrosion inhibitor, at least one solvent (e.g., water), and optional at least one complexing agent, wherein the corrosion inhibitor is selected from the group consisting of 4-methylpyrazole, pyrazole, 2-aminothiazole, 2-amino-1,3,4-thiadiazole, pterine, pyrazine, cytosine, pyridazine, derivatives thereof, and combinations thereof, and wherein the cleaning composition is substantially devoid of alkali hydroxides, alkaline earth metal hydroxides, and tetramethylammonium hydroxide, present in the following range of weight percents, based on the total weight of the composition:

| component | weight percent range | preferred wt. % range |
| --- | --- | --- |
| quaternary base(s) | about 0.001 to about 15 | about 0.001 to about 10 |
| amine(s) | about 0.001 to about 10 | about 0.001 to about 7 |
| corrosion inhibitor(s) | about 0.0001 to about 2 | about 0.0001 to about 0.5 |
| optional complexing agent(s) | 0 to about 10 | 0.001 to about 5 (when present) |
| solvent(s) | balance | balance |

In a particularly preferred embodiment, the cleaning composition of the first aspect comprises, consists of, or consists essentially of tetraethylammonium hydroxide, at least one amine, at least one corrosion inhibitor, at least one complexing agent, and water. Preferably, the corrosion inhibitor is selected from the group consisting of 4-methylpyrazole, pyrazole, 2-amino-thiazole, 2-amino-1,3,4-thiadiazole, pterine, pyrazine, cytosine, pyridazine, derivatives thereof, and combinations thereof, and the cleaning composition is substantially devoid of alkali hydroxides, alkaline earth metal hydroxides, and tetramethylammonium hydroxide. For example, the cleaning composition of the first aspect can comprise, consist of or consist essentially of TEAH, at least one alkanolamine, pyrazole, at least one complexing agent, and water, preferably TEAH, monoethanolamine (MEA), pyrazole, HEDP and water. Preferably, a concentrate of the cleaning composition of the first aspect comprises, consists of, or consists essentially of about 6% to about 10% by weight TEAH, about 2% to about 7% by weight MEA, about 1% to about 4% by weight HEDP, and about 0.05% to about 0.3% by weight pyrazole.

In another particularly preferred embodiment, the cleaning composition of the first aspect comprises, consists of, or consists essentially of benzyltrimethylammonium hydroxide, at least one amine, at least one corrosion inhibitor, at least one complexing agent, and water. Preferably, the corrosion inhibitor is selected from the group consisting of 4-methylpyrazole, pyrazole, 2-amino-thiazole, 2-amino-1,3,4-thiadiazole, pterine, pyrazine, cytosine, pyridazine, derivatives thereof, and combinations thereof, and the cleaning composition is substantially devoid of alkali hydroxides, alkaline earth metal hydroxides, and tetramethylammonium hydroxide. For example, the cleaning composition of the first aspect can comprise, consist of or consist essentially of BTMAH, at least one alkanolamine, pyrazole, at least one complexing agent, and water, preferably BTMAH, monoethanolamine, pyrazole, HEDP and water. Preferably, the cleaning composition of the first aspect comprises, consists of, or consists essentially of about 7% to about 11% by weight BTMAH, about 2% to about 7% by weight MEA, about 1% to about 4% by weight HEDP, and about 0.05% to about 0.3% by weight pyrazole.

In a second aspect, the cleaning compositions generally are aqueous and include at least one cleaning additive, at least one complexing agent, and at least one basic compound, wherein the composition is substantially devoid of amines, alkali hydroxides, alkaline earth metal hydroxides, and tetramethylammonium hydroxide. In one embodiment, the cleaning compositions of the second aspect include at least one cleaning additive, at least one complexing agent, at least one basic compound, and water, wherein the composition is substantially devoid of amines, alkali hydroxides, alkaline earth metal hydroxides, and tetramethylammonium hydroxide. The compositions of the second aspect are useful for removing residue selected from the group consisting of post-CMP residue, post-etch residue, post-ash residue and combinations thereof. Preferably, the compositions of the second aspect are used to remove post-CMP residue. The at least one basic compound can be a species selected from the group consisting of $(NR^1R^2R^3R^4)OH$, $(PR^1R^2R^3R^4)OH$, $(R^1R^2N)(R^3R^4N)C=NR^5$, and any combination thereof, wherein $R^1$, $R^2$, $R^3$, $R^4$ and $R^5$ may be the same as or different from one another and are selected from the group consisting of hydrogen, straight-chained $C_1$-$C_6$ alkyl (e.g., methyl, ethyl, propyl, butyl, pentyl, hexyl), branched $C_1$-$C_6$ alkyl, $C_1$-$C_6$ alkanol (e.g., methanol, ethanol, propanol, butanol, pentanol, hexanol), substituted $C_6$-$C_{10}$ aryl, unsubstituted $C_6$-$C_{10}$ aryl (e.g., benzyl), $CH_2CH_2CH_2C(H)NH_2COOH$, and any combination thereof, with the proviso that when the basic compound is $(NR^1R^2R^3R^4)OH$, $R^1$, $R^2$, $R^3$ and $R^4$ cannot simultaneously be methyl. Basic compounds include tetrabutylphosphonium hydroxide (TBPH), tetramethylphosphonium hydroxide, tetraethylphosphonium hydroxide, tetrapropylphosphonium hydroxide, benzyltriphenylphosphonium hydroxide, methyl triphenylphosphonium hydroxide, ethyl triphenylphosphonium hydroxide, N-propyl triphenylphosphonium hydroxide, tetraethylammonium hydroxide (TEAH), tetrapropylammonium hydroxide (TPAH), tetrabutylammonium hydroxide (TBAH), trimethylethylammonium hydroxide, diethyldimethylammonium hydroxide, tributylmethylammonium hydroxide (TBMAH), benzyltrimethylammonium hydroxide (BTMAH), choline hydroxide, tris(2-hydroxyethyl)methyl ammonium hydroxide, diethyldimethylammonium hydroxide, guanidine acetate, 1,1,3,3-tetramethyl guanidine, guanidine carbonate, arginine, and combinations thereof, may be used. Preferably, the basic compound comprises TBPH, TEAH, BTMAH, 1,1,3,3-tetramethyl guanidine, or any combination thereof. In one preferred embodiment, the basic compound comprises 1,1,3,3-tetramethyl guanidine.

The at least one complexing agent of the compositions of the second aspect include, but are not limited to, ethylenediaminetetraacetic acid (EDTA), 1,2-cyclohexanediamine-N,N,N',N'-tetraacetic acid (CDTA), 4-(2-hydroxyethyl)morpholine (HEM), N-aminoethylpiperazine (N-AEP), glycine, ascorbic acid, iminodiacetic acid (IDA), 2-(hydroxyethyl) iminodiacetic acid (HIDA), nitrilotriacetic acid, alanine, arginine, asparagine, aspartic acid, cysteine, glutamic acid, glutamine, histidine, isoleucine, leucine, lysine, methionine, phenylalanine, proline, serine, threonine, tryptophan, tyrosine, valine, gallic acid, boric acid, acetic acid, acetone oxime, acrylic acid, adipic acid, betaine, dimethyl glyoxime, formic acid, fumaric acid, gluconic acid, glutaric acid, glyceric acid, glycolic acid, glyoxylic acid, isophthalic acid, itaconic acid, lactic acid, maleic acid, maleic anhydride, malic acid, malonic acid, mandelic acid, 2,4-pentanedione, phenylacetic acid, phthalic acid, proline, propionic acid, pyrocatecol, pyromellitic acid, quinic acid, sorbitol, succinic acid, tartaric acid, terephthalic acid, trimellitic acid, trimesic acid, tyrosine, xylitol, 1,5,9-triazacyclododecane-N,N',N"-tris(methylenephosphonic acid) (DOTRP), 1,4,7,10-tetraazacyclododecane-N,N',N",N'"-tetrakis(methylenephosphonic acid) (DOTP), nitrilotris(methylene)triphosphonic acid, diethylenetriaminepenta(methylenephosphonic acid) (DETAP), aminotri(methylenephosphonic acid), 1-hydroxyethylidene-1,1-diphosphonic acid (HEDP), bis(hexamethylene)triamine phosphonic acid, 1,4,7-triazacyclononane-N,N',N"-tris(methylenephosphonic acid (NOTP), dimercaprol, 1,2-propanedithiol, 1,2-dimercaptopropane, Ethanol, 2,2-dimercapto-(9CI), salts and derivatives thereof, and combinations thereof. Preferably, the at least one complexing agent comprises cysteine.

The at least one cleaning additive preferably is capable of both acting as a complexing agent and a buffer and can include at least one species selected from the group consisting of citric acid, ethylenediaminetetraacetic acid (EDTA), 1-hydroxyethylene-1,1-diphosphonic acid (HEDP), glutamic acid, iminodiacetic acid, sulfosalicylic acid, methane sulfonic acid, salicylic acid, phthalic acid, benzene sulfonic acid, oxalic acid, lactic acid, and combinations thereof. In a preferred embodiment, the cleaning additive comprises citric acid.

The cleaning compositions of the second aspect can further comprise at least one reducing agent, at least one metal corrosion inhibitor, at least one surfactant, or any combination thereof. In one embodiment, the cleaning composition of the second aspect comprises, consists of, or consists essentially of at least one cleaning additive, at least one complexing agent, at least one basic compound, and water, wherein the composition is substantially devoid of amines, alkali hydroxides, alkaline earth metal hydroxides, and tetramethylammonium hydroxide. In another embodiment, the cleaning composition of the second aspect comprises, consists of, or consists essentially of at least one cleaning additive, at least one complexing agent, at least one basic compound, water, and at least one reducing agent, wherein the composition is substantially devoid of amines, alkali hydroxides, alkaline earth metal hydroxides, and tetramethylammonium hydroxide. In yet another embodiment, the cleaning composition of the second aspect comprises, consists of, or consists essentially of at least one cleaning additive, at least one complexing agent, at least one basic compound, water, and at least one metal corrosion inhibitor, wherein the composition is substantially devoid of amines, alkali hydroxides, alkaline earth metal hydroxides, and tetramethylammonium hydroxide. In still another embodiment, the cleaning composition of the second aspect comprises, consists of, or consists essentially of at least one cleaning additive, at least one complexing agent, at least one basic compound, water, and at least one surfactant, wherein the composition is substantially devoid of amines, alkali hydroxides, alkaline earth metal hydroxides, and tetramethylammonium hydroxide. In another embodiment, the cleaning composition of the second aspect comprises, consists of, or consists essentially of at least one cleaning additive, at least one complexing agent, at least one basic compound, water, at least one reducing agent, and at least one metal corrosion inhibitor, wherein the composition is substantially devoid of amines, alkali hydroxides, alkaline earth metal hydroxides, and tetramethylammonium hydroxide. In yet another embodiment, the cleaning composition of the second aspect comprises, consists of, or consists essentially of at least one cleaning additive, at least one complexing agent, at least one basic compound, water, at least one reducing agent, and at least one surfactant, wherein the composition is substantially devoid of amines, alkali hydroxides, alkaline earth metal hydroxides, and tetramethylammonium hydroxide. In still another embodiment, the cleaning composition of the second aspect comprises, consists of, or consists essentially of at least one cleaning additive, at least one complexing agent, at least one basic compound, water, at least one metal corrosion inhibitor, and at least one surfactant, wherein the composition is substantially devoid of amines, alkali hydroxides, alkaline earth metal hydroxides, and tetramethylammonium hydroxide. In another embodiment, the cleaning composition of the second aspect comprises, consists of, or consists essentially of at least one cleaning additive, at least one complexing agent, at least one basic compound, water, at least one reducing agent, at least one metal corrosion inhibitor, and at least one surfactant, wherein the composition is substantially devoid of amines, alkali hydroxides, alkaline earth metal hydroxides, and tetramethylammonium hydroxide.

When present, the at least one metal corrosion inhibitor is added to the cleaning composition of the second aspect to lower the corrosion rate of metals, e.g., copper, aluminum, as well as enhance the cleaning performance. Corrosion inhibitors contemplated include, but are not limited to: adenosine, adenine, pyrazole, 1,2,4-triazole, 1,2,3-triazole, imidazole, 3-amino-1,2,4-triazole, 1H-pyrazole-4-carboxylic acid, 3-amino-5-tert-butyl-1H-pyrazole, 5-amino-1H-tetrazole, 4-methylpyrazole, derivatives thereof, and combinations thereof. In a preferred embodiment, the metal corrosion inhibitor comprises adenine.

Reducing agents contemplated include ascorbic acid, L(+)-ascorbic acid, isoascorbic acid, ascorbic acid derivatives, gallic acid, formamidinesulfinic acid, uric acid, tartaric acid, and any combination thereof, preferably ascorbic acid, tartaric acid, or a combination thereof.

Surfactants for use in the compositions of the second aspect include, but are not limited to, amphoteric salts, cationic surfactants, anionic surfactants, fluoroalkyl surfactants, non-ionic surfactants, and combinations thereof including, but not limited to, SURFONYL® 104, TRITON® CF-21, TRITON® CF-10, TRITON® X-100, ZONYL® UR, ZONYL® FSO-100, ZONYL® FSN-100, PLURONIC F-127, 3M Fluorad fluorosurfactants (i.e., FC-4430 and FC-4432), dioctylsulfosuccinate salt, 2,3-dimercapto-1-propanesulfonic acid salt, polyethylene glycols (e.g., PEG 400), polypropylene glycols, polyethylene or polypropylene glycol ethers, carboxylic acid salts, $R_1$ benzene sulfonic acids or salts thereof (where the $R_1$ is a straight-chained or branched $C_8$-$C_{18}$ alkyl group), amphiphilic fluoropolymers, $C_8$-$C_{18}$ alkyl phosphate ethers, carboxylic acid salts, alkylaryl sulfonic acids where the alkyl group is a $C_8$-$C_{18}$ alkyl such as dodecylbenzenesulfonic acid, alkylaryl phosphonic acids where the alkyl group is a $C_8$-$C_{18}$ alkyl, polyacrylate polymers, dinonylphenyl polyoxyethylene, polyethoxylated sorbitans (e.g., polysorbate 80), sorbitans (e.g., sorbitan oleate), silicone or modified silicone polymers, acetylenic diols or modified acetylenic diols, alkylammonium or modified alkylammonium salts, as well as combinations comprising at least one of the foregoing surfactants, sodium dodecyl sulfate, zwitterionic surfactants, aerosol-OT (AOT) and fluorinated analogues thereof, alkyl ammonium, perfluoropolyether surfactants, 2-sulfosuccinate salts, phosphate-based surfactants, sulfur-based surfactants, and acetoacetate-based polymers.

In one embodiment, the cleaning compositions of the second aspect are formulated in the following embodiments, wherein all percentages are by weight, based on the total weight of the formulation:

| component of | % by weight | preferably (% by weight) | more preferably (% by weight) |
| --- | --- | --- | --- |
| cleaning additive(s) | about 0.001% to about 10% | about 0.001% to about 5% | about 0.001% to about 4% |
| complexing agent(s) | about 0.001% to about 25% | about 0.001% to about 20% | about 0.001% to about 17% |
| basic compound(s) | about 0.001% to about 40% | about 0.001% to about 30% | about 0.001% to about 25% |
| water | balance | balance | balance |
| reducing agent(s) | 0 to about 10% | 0 to about 5% | 0 to about 5% |
| corrosion inhibitor(s) | 0 to about 5% | 0 to about 1% | 0 to about 0.5% |
| surfactant(s) | 0 to about 5% | 0 to about 1% | 0 to about 0.5% |

When present, the lower limit of the reducing agent and surfactant in the composition is about 0.0001%. When present, the lower limit of corrosion inhibitor in the composition is about 0.001%.

The cleaning compositions of either aspect are particularly useful for cleaning residue and contaminants, e.g., post-CMP residue, post-etch residue, post-ash residue, and contaminants from a microelectronic device structure. Regardless of the embodiment, the cleaning compositions of either aspect are preferably substantially devoid of at least one of oxidizing agents (e.g., hydrogen peroxide); fluoride-containing sources; abrasive materials; alkali and/or alkaline earth metal bases; tetramethylammonium hydroxide; and combinations thereof, prior to removal of residue material from the microelectronic device. In addition, the cleaning compositions should not solidify to form a polymeric solid, for example, photoresist.

The pH of the cleaning compositions of either aspect is greater than 7, preferably in a range from about 10 to greater than 14, most preferably in a range from about 12 to about 14.

The range of weight percent ratios of the components will cover all possible concentrated or diluted embodiments of the compositions of either aspect. Towards that end, in one embodiment, a concentrated cleaning composition is provided that can be diluted for use as a cleaning solution. A concentrated cleaning composition, or "concentrate," advantageously permits a user, e.g. CMP process engineer, to dilute the concentrate to the desired strength and pH at the point of use. Dilution of the concentrated cleaning composition may be in a range from about 1:1 to about 2500:1, preferably about 5:1 to about 200:1, and most preferably about 10:1 to about 50:1, wherein the cleaning composition is diluted at or just before the tool with solvent, e.g., deionized water. It is to be appreciated by one skilled in the art that following dilution, the range of weight percent ratios of the components disclosed herein should remain unchanged.

The compositions of either aspect may have utility in applications including, but not limited to, post-etch residue removal, post-ash residue removal surface preparation, post-plating cleaning and post-CMP residue removal. In addition, it is contemplated that the cleaning compositions of either aspect may be useful for the cleaning and protection of other metal (e.g., copper-containing) products including, but not limited to, decorative metals, metal wire bonding, printed circuit boards and other electronic packaging using metal or metal alloys.

In yet another preferred embodiment, the cleaning compositions of either aspect further include residue and/or contaminants. The residue and contaminants may be dissolved in the compositions. Alternatively, the residue and contaminants may be suspended in the compositions. Preferably, the residue includes post-CMP residue, post-etch residue, post-ash residue, contaminants, or combinations thereof.

The cleaning compositions of either aspect are easily formulated by simple addition of the respective ingredients and mixing to homogeneous condition. Furthermore, the compositions of either aspect may be readily formulated as single-package formulations or multi-part formulations that are mixed at or before the point of use, e.g., the individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

Accordingly, another aspect relates to a kit including, in one or more containers, one or more components adapted to form the cleaning compositions described herein. The kit may include, in one or more containers, at least one corrosion inhibitor, at least one quaternary base, at least one organic amine, and optionally at least one solvent and at least one complexing agent, for combining with solvent, e.g., water, at the fab or the point of use. Alternatively, the kit may include, in a first container at least one corrosion inhibitor, and in a second container at least one quaternary base, at least one organic amine, and optionally at least one solvent and at least one complexing agent, for combining with each other and solvent, e.g., water, at the fab or the point of use. In still another alternative, the kit includes, in one or more containers, at least one cleaning additive, at least one complexing agent, at least one basic compound, optionally at least one reducing agent, optionally at least one metal corrosion inhibitor, and optionally at least one surfactant, for combining with solvent, e.g., water, at the fab or the point of use. The containers of the kit must be suitable for storing and shipping said cleaning compositions, for example, NOWPak® containers (Advanced Technology Materials, Inc., Danbury, Conn., USA). The kit containers preferably are substantially devoid of alkali hydroxides, alkaline earth metal hydroxides, and tetramethylammonium hydroxide.

As applied to microelectronic manufacturing operations, the cleaning compositions of either aspect are usefully employed to clean post-CMP residue and/or contaminants from the surface of the microelectronic device. The cleaning compositions do not damage low-k dielectric materials or corrode metal interconnects on the device surface. Preferably the cleaning compositions of either aspect remove at least 85% of the residue present on the device prior to residue removal, more preferably at least 90%, even more preferably at least 95%, and most preferably at least 99%.

In post-CMP residue and contaminant cleaning application, the cleaning composition of either aspect may be used with a large variety of conventional cleaning tools such as megasonics and brush scrubbing, including, but not limited to, Verteq single wafer megasonic Goldfinger, OnTrak systems DDS (double-sided scrubbers), SEZ or other single wafer spray rinse, Applied Materials Mirra-Mesa™/Reflexion™/Reflexion LK™, and Megasonic batch wet bench systems.

In use of the compositions of either aspect for cleaning post-CMP residue, post-etch residue, post-ash residue and/or contaminants from microelectronic devices having same thereon, the cleaning composition typically is contacted with the device for a time of from about 5 sec to about 10 minutes, preferably about 1 sec to 20 min, preferably about 15 sec to about 5 min at temperature in a range of from about 20° C. to about 90° C., preferably about 20° C. to about 50° C. Such contacting times and temperatures are illustrative, and any other suitable time and temperature conditions may be employed that are efficacious to at least partially clean the post-CMP residue/contaminants from the device, within the broad practice of the method. "At least partially clean" and "substantial removal" both correspond to at removal of at least 85% of the residue present on the device prior to residue removal, more preferably at least 90%, even more preferably at least 95%, and most preferred at least 99%

Following the achievement of the desired cleaning action, the cleaning compositions may be readily removed from the device to which it has previously been applied, as may be desired and efficacious in a given end use application of the compositions described herein. Preferably, the rinse solution includes deionized water. Thereafter, the device may be dried using nitrogen or a spin-dry cycle.

Yet another aspect relates to the improved microelectronic devices made according to the methods described herein and to products containing such microelectronic devices.

Another aspect relates to a recycled cleaning composition, wherein the cleaning composition may be recycled until residue and/or contaminant loading reaches the maximum amount the cleaning composition may accommodate, as readily determined by one skilled in the art.

A still further aspect relates to methods of manufacturing an article comprising a microelectronic device, said method comprising contacting the microelectronic device with a cleaning composition for sufficient time to clean post-CMP residue and contaminants from the microelectronic device having said residue and contaminants thereon, and incorporating said microelectronic device into said article, using a cleaning composition described herein.

In another aspect, a method of removing post-CMP residue and contaminants from a microelectronic device having same thereon is described, said method comprising:

polishing the microelectronic device with a CMP slurry;

contacting the microelectronic device with a cleaning composition comprising at least one corrosion inhibitor, for a sufficient time to remove post-CMP residue and contaminants from the microelectronic device to form a post-CMP residue-containing composition; and continuously contacting the microelectronic device with the post-CMP residue-containing composition for a sufficient amount of time to effect substantial cleaning of the microelectronic device, wherein the at least one corrosion inhibitor comprises a species selected from the group consisting of 4-methylpyrazole, pyrazole, 1,2,4-triazole, 1,2,3-triazole, imidazole, 3-amino-1,2,4-triazole, 2-amino-thiazole, 2-amino-1,3,4-thiadiazole, pterine, pyrazine, cytosine, pyridazine, derivatives thereof, and combinations thereof.

In still another aspect, a method of removing post-CMP residue and contaminants from a microelectronic device having same thereon is described, said method comprising:
polishing the microelectronic device with a CMP slurry; and
contacting the microelectronic device with a cleaning composition comprising at least one cleaning additive, at least one complexing agent, at least one basic compound, and water, for a sufficient time to remove post-CMP residue and contaminants from the microelectronic device to form a post-CMP residue-containing composition,
wherein the cleaning composition is substantially devoid of amines, alkali hydroxides, alkaline earth metal hydroxides, and tetramethylammonium hydroxide.

Another aspect relates to an article of manufacture comprising a cleaning composition, a microelectronic device wafer, and material selected from the group consisting of residue, contaminants and combinations thereof, wherein the cleaning composition comprises at least one solvent, at least one corrosion inhibitor, at least one amine, at least one quaternary base, and optionally at least one complexing agent, wherein the at least one corrosion inhibitor comprises a species selected from the group consisting of 4-methylpyrazole, pyrazole, 2-amino-thiazole, 2-amino-1,3,4-thiadiazole, pterine, pyrazine, cytosine, pyridazine, 1,2,4-triazole, 1,2,3-triazole, imidazole, 3-amino-1,2,4-triazole, derivatives thereof, and combinations thereof, the cleaning composition is substantially devoid of alkali hydroxides, alkaline earth metal hydroxides, and tetramethylammonium hydroxide, and the residue comprises at least one of post-CMP residue, post-etch residue and post-ash residue.

Another aspect relates to an article of manufacture comprising a cleaning composition, a microelectronic device wafer, and material selected from the group consisting of residue, contaminants and combinations thereof, wherein the cleaning composition comprises at least one cleaning additive, at least one complexing agent, at least one basic compound, and water, wherein the composition is substantially devoid of amines, alkali hydroxides, alkaline earth metal hydroxides, and tetramethylammonium hydroxide, and the residue comprises at least one of post-CMP residue, post-etch residue and post-ash residue.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. A cleaning composition comprising at least one quaternary base present in an amount ranging from about 6% to about 10% by weight, at least one organic amine present in an amount ranging from about 1% to about 7% by weight, at least one corrosion inhibitor present in an amount ranging from about 0.05% to about 0.3% by weight, at least one complexing agent present in amount ranging from about 1% to 4% by weight, and at least one solvent, wherein the corrosion inhibitor is selected from the group consisting of 4-methylpyrazole, pyrazole, 2-amino-thiazole, 2-amino-1,3,4-thiadiazole, pterine, pyrazine, cytosine, pyridazine, derivatives thereof, and combinations thereof, and wherein the cleaning composition is substantially devoid of alkali hydroxides, alkaline earth metal hydroxides, and tetramethylammonium hydroxide.

2. The cleaning composition of claim 1, wherein the at least one organic amine comprises a species selected from the group consisting of aminoethylethanolamine, N-methylaminoethanol, aminoethoxyethanol, dimethylaminoethoxyethanol, diethanolamine, N-methyldiethanolamine, monoethanolamine, triethanolamine, 1-amino-2-propanol, 3-amino-1-propanol, diisopropylamine, isopropylamine, 2-amino-1-butanol, isobutanolamine, other $C_1$-$C_8$ alkanolamines, triethylenediamine, ethylenediamine, hexamethylenediamine, diethylenetriamine, triethylamine, trimethylamine, 1-methoxy-2-aminoethane, tetraethylenepentamine (TEPA), 4-(2-hydroxyethyl)morpholine (HEM), N-aminoethylpiperazine (N-AEP), ethylenediaminetetraacetic acid (EDTA), 1,2-cyclohexanediamine-N,N,N',N'-tetraacetic acid (CDTA), glycine/ascorbic acid, iminodiacetic acid (IDA), 2-(hydroxyethyl)iminodiacetic acid (HIDA), nitrilotriacetic acid, thiourea, 1,1,3,3-tetramethylurea, urea, urea derivatives, glycine, alanine, arginine, asparagine, aspartic acid, cysteine, glutamic acid, glutamine, histidine, isoleucine, leucine, lysine, methionine, phenylalanine, piperadine, N-(2-aminoethyl) piperadine, proline, pyrrolidine, serine, threonine, tryptophan, tyrosine, valine, and combinations thereof.

3. The cleaning composition of claim 1, wherein the at least one quaternary base comprises a species selected from the group consisting of tetraethylammonium hydroxide (TEAH), tetrapropylammonium hydroxide (TPAH), tetrabutylammonium hydroxide (TBAH), tributylmethylammonium hydroxide (TBMAH), benzyltrimethylammonium hydroxide (BTMAH), choline hydroxide, tris(2-hydroxyethyl)methyl ammonium hydroxide, diethyldimethylammonium hydroxide, choline hydroxide, and combinations thereof.

4. The cleaning composition of claim 1, wherein the at least one complexing agent comprises a species selected from the group consisting of acetic acid, acetone oxime, acrylic acid, adipic acid, alanine, arginine, asparagine, aspartic acid, betaine, dimethyl glyoxime, formic acid, fumaric acid, gluconic acid, glutamic acid, glutamine, glutaric acid, glyceric acid, glycerol, glycolic acid, glyoxylic acid, histidine, iminodiacetic acid, isophthalic acid, itaconic acid, lactic acid, leucine, lysine, maleic acid, maleic anhydride, malic acid, malonic acid, mandehc acid, 2,4-pentanedione, phenylacetic acid, phenylalanine, phthalic acid, proline, propionic acid, pyrocatecol, pyromellitic acid, quinic acid, serine, sorbitol, succinic acid, tartaric acid, terephthalic acid, trimellitic acid, trimesic acid, tyrosine, valine, xylitol, ethylenediamine, oxalic acid, tannic acid, benzoic acid, ammonium benzoate, catechol, pyrogallol, resorcinol, hydroquinone, cyanuric acid, barbituric acid, 1,2-dimethylbarbituric acid, pyruvic acid, phosphonic acid, 1-hydroxyethylidene-1,1-diphosphonic acid (HEDP), propanediol, benzohydroxamic acids, salts and derivatives thereof, and combinations thereof.

5. The cleaning composition of claim 1, wherein the solvent comprises water.

6. The cleaning composition of claim 1, further comprising residue and contaminants, wherein the residue comprises post-CMP residue, post-etch residue, post-ash residue, or combinations thereof.

7. The cleaning composition of claim 1, wherein the composition is substantially devoid of at least one of oxidizing agents; fluoride-containing sources; abrasive materials; and combinations thereof.

8. A method of removing residue and contaminants from a microelectronic device having said residue and contaminants thereon, said method comprising contacting the microelectronic device with a cleaning composition of claim 1 for sufficient time to at least partially clean said residue and contaminants from the microelectronic device.

* * * * *